United States Patent [19]

Müller et al.

[11] Patent Number: 4,724,195
[45] Date of Patent: Feb. 9, 1988

[54] PERFLUOROALKYL GROUP-CONTAINING COPOLYMERS AND REPRODUCTION LAYERS PRODUCED THEREFROM

[75] Inventors: Werner H. Müller, E. Greenwich, R.I.; Arnold Schneller, Mainz, Fed. Rep. of Germany

[73] Assignee: Hoechst Aktiengesellschaft, Frankfurt am Main, Fed. Rep. of Germany

[21] Appl. No.: 742,394

[22] Filed: Jun. 7, 1985

[30] Foreign Application Priority Data

Jun. 8, 1984 [DE] Fed. Rep. of Germany ....... 3421526

[51] Int. Cl.$^4$ .......................... G03C 1/60; G03C 1/68; G03C 1/71
[52] U.S. Cl. ........................................ 430/192; 430/49; 430/96; 430/175; 430/197; 430/281; 430/284; 430/285; 430/165; 430/303
[58] Field of Search ............... 430/192, 181, 185, 910, 430/175, 197, 303, 281, 284, 285, 96, 49, 165; 528/86

[56] References Cited

U.S. PATENT DOCUMENTS

| | | | |
|---|---|---|---|
| 3,511,178 | 5/1970 | Curtin | 101/450 |
| 3,629,197 | 12/1971 | Stiehl, Jr. | 260/47 |
| 3,677,178 | 7/1972 | Gipe | 101/450 |
| 3,682,633 | 8/1972 | Curtin | 96/27 |
| 3,790,382 | 2/1974 | Dahlman | 430/175 |
| 3,901,700 | 8/1975 | Yoerger et al. | 430/302 |
| 3,910,187 | 10/1975 | Cords | 101/450 |
| 3,953,212 | 4/1976 | Miyano et al. | 96/75 |
| 4,087,584 | 5/1978 | Taniguchi et al. | 428/422 |
| 4,430,379 | 2/1984 | Hoyakawa et al. | 430/302 |
| 4,508,814 | 4/1985 | Sakuvai et al. | 430/175 |

FOREIGN PATENT DOCUMENTS

| | | |
|---|---|---|
| 0037094 | 10/1981 | European Pat. Off. . |
| 0040841 | 12/1981 | European Pat. Off. . |
| 0096845 | 12/1983 | European Pat. Off. . |
| 1043504 | 9/1966 | United Kingdom . |
| 1464123 | 10/1971 | United Kingdom . |
| 1501128 | 2/1978 | United Kingdom . |

*Primary Examiner*—Charles L. Bowers, Jr.
*Attorney, Agent, or Firm*—Schwartz, Jeffery, Schwaab, Mack, Blumenthal & Evans

[57] ABSTRACT

Copolymers comprising perfluoroalkyl groups, reproduction layers containing these copolymers and use thereof for waterless offset printing. The novel perfluoroalkyl group-containing copolymers are prepared from at least two different monomers, monomer (a) comprising acryloyl or methacryloyl groups and phenolic OH groups and monomer (b) comprising acryloyloxy, methacryloyloxy or vinyl groups and a perfluoroalkyl group. Monomer component (a) can, for example, be prepared from a hydroxybenzoic acid by esterification with a hydroxyalkyl-acrylate. The novel copolymers are, in particular, used as binders in radiation-sensitive reproduction layers which additionally contain at least one radiation-sensitive compound. Reproduction layers of this kind are used as radiation-sensitive coatings of support materials for printing plates used in waterless offset printing.

10 Claims, No Drawings

PERFLUOROALKYL GROUP-CONTAINING COPOLYMERS AND REPRODUCTION LAYERS PRODUCED THEREFROM

BACKGROUND OF THE INVENTION

The present invention relates to copolymers comprising perfluoroalkyl groups and to a process for the production of these copolymers. The invention also relates to radiation-sensitive reproduction layers containing these copolymers as binders and to the use of these reproduction layers for waterless offset printing.

Other than in the customarily used offset-printing process, where differentiation between image areas and non-image areas during printing is effected by the simultaneous action of water or water-containing liquids, on the one hand, and printing ink, on the other hand, differentiation in waterless planographic printing, particularly offset printing, normally results from the fact that the ink-receptive, i.e., oleophilic, image areas and the ink-repellent, i.e., oleophobic, non-image areas (which are not moist with water) on a printing plate surface show different interactions with the printing ink. From the state of the art, the following publications are known.

U.S. Pat. No. 3,677,178 discloses a printing plate in which a support material comprising a metal, a plastic, or paper is coated with a layer of a hydrophobic and oleophobic silicone rubber and a radiation-sensitive reproduction layer, in the indicated or in the reverse order. As the radiation-sensitive compound, the reproduction layer contains ammonium dichromate, formaldehyde condensates of diphenylamine-4-diazonium salts, or polyvinyl cinnamate. In the printing process, the ink-receptive areas either comprise bared portions of the support material or portions of the reproduction layer which have been cured by irradiation.

In the printing plate according to U.S. Pat. No. 3,511,178 and U.S. Pat. No. 3,682,633, the support material is first coated with a radiation-sensitive reproduction layer and then with a coating having a lower release value (reduced adhesive interaction) with respect to printing inks than the support material. The last-mentioned coating either comprises a polysiloxane (silicone elastomer) or a fluorine-containing organic compound, for example, a homopolymer of the methacrylic acid ester of perfluorooctanol.

Further embodiments of printing plates for waterless offset-printing and of compounds which are suitable for use in printing plates of this kind are, for example, disclosed in the following publications:

U.S. Pat. No. 3,953,212 discloses a combination of a radiation-sensitive compound and a silicone rubber in one layer which is applied to one of the customary support materials. The printing plate according to German Auslegeschrift No. 24 22 428 (equivalent to British Pat. No. 1,464,123) contains a photopolymerizable polysiloxane and a photosensitizer in a single layer.

In German Offenlegungsschrift No. 25 24 562 (equivalent to British Pat. No. 1,501,128) radiation-sensitive coatings are described, which comprise an aromatic diazonium cation, an anion of a carboxylic acid or sulfonic acid containing perfluoroalkyl groups and, optionally, a polymeric organic binder. It is stated that these layers can be used for printing directly after irradiation, i.e., a developing step is not required.

The printing plates according to U.S. Pat. No. 4,087,584 comprise, in an oleophobic coating, a fluorine-containing homopolymer or copolymer having monomer units derived from acrylic or methacrylic acid esters containing perfluoroalkyl groups, 4-perfluoroalkoxy-benzoyloxy-alkyl groups, or perfluoroalkane-sulfonamido-alkyl groups. In copolymers, the proportion of the fluorine-containing monomer units exceeds 75%. This oleophobic coating is either present directly on a support material and image areas are applied to the coating or it is present on top of an electrophotographically working reproduction layer. In the latter case, toner images are produced on the oleophobic coating.

U.S. Pat. No. 3,910,187 discloses various possibilities of producing printing plates for use in waterless offset printing by applying an intermediate or final layer to customary photopolymer printing plates (i.e., printing plates comprising a support material and a reproduction layer containing photopolymerizable compounds). These intermediate or final layers comprise perfluoroalkyl group-containing carboxylic acids, sulfonic acids, phosphonic acids and amines or polymers of perfluoroalkyl group-containing acrylic or methacrylic acid esters, maleic acid diesters, vinyl ethers, carboxylic acid vinyl esters, sulfonamido-allyl esters, and the like. The polymers are either prepared from the above-indicated monomers before application to the printing plate or are produced by photopolymerization directly on the printing plate.

According to published European Patent Application No. 0,037,094, it is possible to prepare radiation-sensitive polymers for, among other uses, as coatings for printing plates, which contain copolymers of (a) acrylic or methacrylic acid perfluoroalkyl esters and (b) acrylic or methacrylic acid acidobenzoyloxyalkyl esters. In addition to these copolymers, radiation-sensitive reproduction layers can also contain alkaline-developable organic binders and customary additives. After irradiation and development, a relief image is produced on the support material.

Published European Patent Application No. 0,040,841 describes radiation-sensitive polymers, comprising copolymers of (a) monomers having perfluoroalkyl end groups and ethylenically unsaturated end groups and (b) monomers having radiation-sensitive groups and ethylenically unsaturated groups. The monomers mentioned under (a) include, for example, acrylic or methacrylic acid perfluoroalkyl esters and the monomers mentioned under (b) include, for example, methacrylic acid azidobenzoyloxyalkyl esters, acrylic acid cinnamoyloxyalkyl esters, methacrylic acid benzoylphenyl esters, or methacrylic acid cinnamoylphenyl esters.

From published European Patent Application No. 0,096,845 radiation-sensitive polymers are known which comprise copolymers of (a) acrylic or methacrylic acid-2-perfluoroalkoxy-2-fluoro-ethyl-1-esters or related compounds, (b) monomers containing radiation-sensitive groups and ethylenically unsaturated groups, and (c) optionally further fluorine-free copolymerizable vinyl monomers.

In the hitherto known reproduction layers for the production of printing plates used in waterless off-set printing, organic solvents such as 2-butoxyethanol, ethylene glycol monoethyl ether, methylene chloride, dioxane, or hexafluoro-m-xylene, must frequently be used in the developing step. Because of this, expensive redistillation units and the like are required to enable an ecologically acceptable reclaiming of these solvents. Moreover, the synthesis of the starting components is often difficult (for example, requiring several stages), so that they are not at all or only to a minor degree suitable for large-scale industrial application. Reproduction layers which do not contain a binder and/or are not subjected to an additionally differentiating developing step after the irradiation thereof, generally do not yield relatively large print runs. Reproduction layers which include a binder and already contain a fluoroalkyl group-containing compound as the radiation-sensitive component, are not readily prepared, since it is often impossible or at least difficult to combine the customary binders with these compounds to form a homogeneously acting coating. The effects of a possible incompatibility of the two principal components of reproduction layers, i.e., the radiation-sensitive component and the binder component, frequently do not appear in the preparation of the coating composition, but are discovered only during or after drying of the layers, i.e., when the solvent or dispersing agent is removed.

SUMMARY OF THE INVENTION

It is accordingly an object of the present invention to synthesize novel perfluoroalkyl group-containing copolymers.

It is another object of the invention to provide perfluoroalkyl group-containing polymers, as above, which are particularly suited for use in the field of waterless offset printing.

Yet another object of the invention is to produce perfluoroalkyl group-containing polymers, as above, which exhibit a good compatibility with other components.

Still another object of the invention is to provide perfluoroalkyl group-containing polymers, as above, which can, as far as possible, be produced from commercially available starting materials (educts).

Yet another object of the invention is to provide perfluoroalkyl group-containing polymers, as above, which are developable with aqueous solutions (particularly aqueous alkaline solutions) after irradiation, when they are used in reproduction layers.

The objects of the invention are achieved by a perfluoroalkyl group-containing copolymer comprising the reaction product of at least two different monomers, each monomer having a polymerizable ethylenically unsaturated end group, one of the monomers having a perfluoroalkyl group, wherein monomers selected from the group consisting of:

(a) monomers containing acryloyl or methacryloyl groups and phenolic OH groups and corresponding to the formula (I),

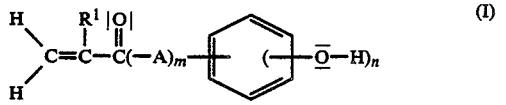

wherein $R^1$ is H or $CH_3$; n is 1, 2, or 3; m is 0 or 1 and A is selected from the group consisting of

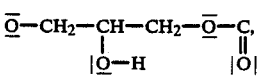

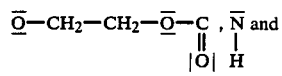

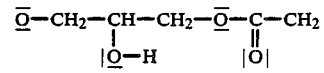

are copolymerized with monomers selected from the group consisting of (b) monomers containing acryloyloxy, methacryloyloxy or vinyl groups and a perfluoroalkyl group and corresponding to the formulae (II) or (III)

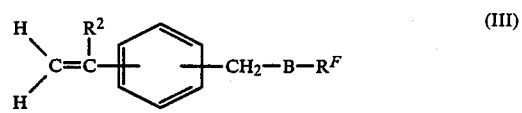

wherein $R^1$ has the above meaning, $R^2$ is H or alkyl from $C_1$ to $C_5$; B is $\overline{O}$ or

$R^F$ is $F(C_wF_{2w})$ $(—CH_2)_z$ or $F(C_{w-1}F_{2w-2})—CF=CH$, the difluoromethylene groups optionally being linked through ether bridges, w is 5 to 15 and z is 0 to 5.

The objects of the invention are also achieved by a process for producing a perfluoroalkyl group-containing copolymer, which comprises the steps of:

(a) reacting a compound selected from the group consisting of hydroxybenzoic acids, (hydroxyphenyl)-acetic acid and aminophenols, with a compound selected from the group consisting of hydroxyalkylacrylates or methacrylates, glycidylacrylates or methacrylates, acrylic or methacrylic acid, and acrylic or methacrylic acid derivatives to form the corresponding ester or amide, producing thereby a monomer having the foregoing formula (I)

(b) reacting the monomer of step (a) with a monomer containing acryloyloxy, methacryloyloxy or vinyl groups and a perfluoroalkyl group and corresponding to one of the foregoing formulae (II) or (III).

The objects of the invention are further achieved by a radiation-sensitive reproduction layer which comprises at least one radiation-sensitive compound and an organic binder, the binder being a copolymeric reaction product of:

(a) at least one monomer containing acryloyl or methacryloyl groups and phenolic OH groups and corresponding to the foregoing formula (I); and (b) at least one monomer containing acryloyloxy, methacryloyloxy or vinyl groups and a perfluoroalkyl group and corresponding to one of the foregoing formulae (II) or (III).

DETAILED DESCRIPTION OF THE PREFERRED EMBODIMENTS

The invention provides perfluoroalkyl group-containing copolymers prepared from at least two different monomers comprising, in each case, a polymerizable ethylenically unsaturated end group. One of the two monomers has a perfluoroalkyl group. The monomers of the invention, which are copolymerized include:

(a) monomers containing acryloyl or methacryloyl groups and phenolic OH groups and corresponding to the foregoing formula (I); and (b) monomers containing acryloyloxy, methacryloyloxy, or vinyl groups and a perfluoroalkyl group and corresponding to the foregoing formula (II) or (III).

In preferred embodiments, the copolymers are prepared from 10 to 90% of monomer component (a) and from 90 to 10% of monomer component (b), in particular from 20 to 80% of (a) and from 80 to 20% of (b), and preferably m stands for 1, A is

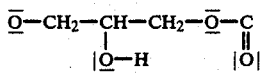

and n is 1, based on formula (I); w is 6 to 12, z is 0 to 2 and B is $\overline{O}$, based on formulae (II) and (III). In principle, the copolymers are prepared in such a way that each of the omonomer components must be present in an amount of at least 0.5%.

The indicated substituent groups of the compounds according to formulae (I) and (III) are attached to different carbon atoms of the molecules of these compounds. In compound (II), however, this is not necessarily the case. The perfluoroalkyl group is, either directly or through an unbranched or branched, saturated or unsaturated alkylene intermediate member having from 1 to 5 carbon atoms, linked to the ester function in formula (II) or to the ether or amide function in formula (III). The perfluoroalkyl groups may be unsaturated or saturated, branched or unbranched and generally have from 5 to 15 carbon atoms, particularly from 6 to 12 carbon atoms. They are preferably unbranched molecular radicals and have a maximum of two double bonds per molecular radical.

The molecular weights of the copolymers of the present invention are generally in the range from about 1,000 to 100,000, particularly in the range from 3,000 to 50,000. Copolymerization of components (a) and (b) is carried out under the usual conditions of reaction, for example, in the presence of a polymerization initiator, such as azobisisobutyronitrile, in an organic solvent, such as butanone-2, at an elevated temperature of from about 40° to about 100° C., and during a period of from about 1 to about 12 hours. The aforementioned solution-polymerization is preferred, but it is also possible to carry out suspension, emulsion, or mass polymerization, which are normally also run in the presence of a polymerization initiator. In some cases, it is even possible to photopolymerize the monomers in the presence of a photoinitiator.

As a rule, component (a) must also first be synthesized. For this purpose, particularly a hydroxybenzoic acid, a (hydroxyphenyl)-acetic acid, or an aminophenol is reacted with a hydroxyalkylacrylate, glycidylacrylate, the corresponding methacrylate or an acrylic acid, an acrylic acid derivative (e.g. ester or halide) or the corresponding methacrylic compound, to form the corresponding ester or amide. A preferred example of this reaction is the preparation of monomers of the formula (VII), which represent a preferred embodiment of the formula (I), in which m is 1 and A is

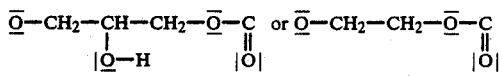

by esterification of hydroxybenzoic acid of the formula (IV) with hydroxyalkylacrylate or glycidylacrylate or the corresponding methacrylate, respectively, of the formulae (V) and (VI):

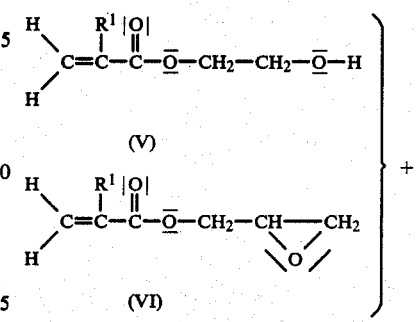

Another example of the synthesis of component (a) is the indicated reaction of an aminophenol of the formula (VIII) with an acrylic or methacrylic compound of the formula (IX) to form the corresponding amides (X):

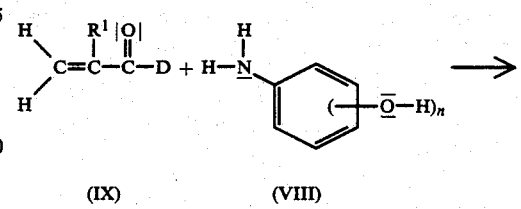

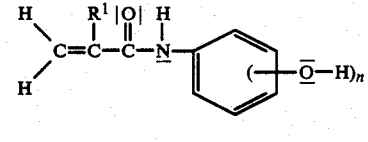

Examples of compound (b) are, on the one hand, acrylates or methacrylates of perfluoroalcohols or perfluoroalkylalkanols, such as 1,1-dihydro-perfluorooctanol-1; perfluorooctanol-1; 1,1,2,2-tetrahydro-perfluorooctanol-1; 1,1,2,2-tetrahydro-perfluorodecanol-1; 1,1,2,2-tetrahydro-perfluorododecanol-1; 1,1,2,2-tetrahydro-perfluorotetradecanol-1; 1,1,9-trihydro-perfluorononanol-1; 1,1,11-trihydro-perfluoroundecanol-1 and 9-trifluoromethyl-1,1,2,2-tetrahydro-perfluorodecanol-1; or of perfluoroalkylalkanols or perfluoroalcohols containing perfluoroalkylene oxide groups, such as 3,3,3-trifluoro-2-(perfluoropropyloxy-bis-perfluoropropylenoxy)-2-fluoropropanol-1

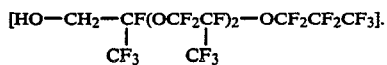

and, on the other hand, vinyl benzyl ethers of the abovementioned alcohols.

If required in special fields of application, other types of monomers can be used in addition to the indicated monomer components (a) and (b). Examples of such monomers which are different from (I), (II), and (III) include acrylic acid, methacrylic acid, the esters thereof, alkanoic acid vinyl esters, styrenes, vinyl halides, vinylidene halides, vinyl alkyl ketones, acrylamides, and dienes, such as 2,3-dihalo-1,3-butadiene. However, monomers of this kind should not exceed a proportion of 40% in the copolymer.

The perfluoroalkyl group-containing copolymers of the present invention can be used in the production of hydrophobic and oleophobic compositions, such as varnishes, impregnating or coating agents, but particularly, in the preparation of radiation-sensitive reproduction layers. Therefore, the invention also provides radiation-sensitive reproduction layers containing (c) at least one radiation-sensitive compound and (d) at least one organic polymeric binder, wherein component (d) is a copolymer comprising the above defined components (a) and (b). The binders used include, in particular, copolymers which are soluble in aqueous-alkaline solutions. If the copolymers of the present invention are used as component (d) in reproduction layers, component (c) particularly comprises compounds which also contain fluorine or, preferably, perfluoroalkyl groups, since this will frequently result in an improved miscibility of components and thus in a coating which is even more uniform optically. In addition to the copolymers according to the invention, the reproduction layers can also contain binders which are different from the copolymers, but the proportion of such different binders should not exceed 40% of the amount of binder used.

Examples of suitable binders include: polyamides, polyvinyl esters, polyvinyl acetals, polyvinyl ethers, polyacrylates, polymethacrylates, polyesters, alkyd resins, polyacrylamide, polyvinyl alcohol, polyethylene oxide, polydimethyl acrylamide, polyvinyl methylformamide, polyvinyl methylacetamide and copolymers of the monomers forming the enumarated homopolymers. Also suitable are binders comprising natural substances or converted natural substances, for example, gelatin or cellulose ethers.

It is advantageous to use binders which are soluble or at least swellable in aqueous-alkaline solutions, since layers comprising these binders can be developed with the preferred aqueous-alkaline developers. Binders of this kind, for example, can comprise the following groups: —COOH, —PO₃H₂, —SO₃H, —SO₂NH₂, and —SO₂—NH—CO—. Examples of such binders include: maleinate resins, polymers of β-methacryloyloxy-ethyl-N-(p-tolylsulfonyl)-carbamate and copolymers of these and similar monomers with other monomers, and also methylmethacrylate/methacrylic acid copolymers, or copolymers of methacrylic acid, alkylmethacrylates and methylmethacrylate and/or styrene, acrylonitrile, etc.

As component (c), i.e., the component comprising radiation-sensitive compounds, the reproduction layers basically can contain any compounds which after irradiation (exposure) and development yield a surface in imagewise configuration, which can be used for printing.

Apart from the silver halide-containing layers used for many applications, various other layers are known which are, for example, described in "Light-Sensitive Systems" by Jaromir Kosar, published by John Wiley & Sons, New York, 1965: colloid layers containing chromates and dichromates (Kosar, Chapter 2); layers containing unsaturated compounds, in which, upon exposure, these compounds are isomerized, rearranged, cyclized, or crosslinked (Kosar, Chapter 4); layers containing compounds which can be photopolymerized, in which, on being exposed, monomers or prepolymers undergo polymerization, optionally with the aid of an initiator (Kosar, Chapter 5); and layers containing o-diazoquinones, such as naphthoquinone-diazides, p-diazoquinones, or condensation products of diazonium salts (Kosar, Chapter 7). The layers which are suitable also include the electrophotographic layers, i.e., layers which contain an inorganic or organic photoconductor.

The particularly preferred radiation-sensitive compounds or systems in component (c) of the reproduction layers include the classes of compounds described for the first time in copending U.S. patent application Ser. No. 742,392 filed June 7, 1985 entitled "Perfluoroalkyl Group-Containing Compounds and Reproduction Layers Produced Therefrom" (equivalent to German Patent Application No. P 34 21 511.5), and Ser. No. 742,418 entitled "Perfluoroalkyl Group-Containing 1,2-Naphthoquinone Diazide Compounds and Reproduction Materials Produced Therefrom" (equivalent to German Patent Application No. P 34 21 417.2), i.e., a system comprising at least one polymerizable, perfluoroalkyl group-containing compound having at least two ethylenically unsaturated end groups and at least one photoinitiator or 1,2-naphthoquinone diazide compounds having at least one perfluoroalkyl group as a substituent.

The reproduction layers generally contain from 5 to 50% of component (c); if photopolymerizable compounds or systems are used, component (c) may also be present in an amount of up to 80%. Component (d) is contained in the reproduction layers in an amount from 95 to 50% or up to 20%, if photopolymerizable compounds are used as component (c).

In addition to components (c) and (d) the indicated reproduction layers can contain a number of other customary additives, for example, inhibitors to prevent thermal polymerization of monomers, hydrogen donors, sensitometric regulators, levelling agents, indicators, dyes, and colored and uncolored pigments. The sum of all components should add up to 100%. These components are appropriately selected to minimize absorption in the region of acitinic radiation, which is important for the initiating process. Actinic radiation is to be understood as any radiation, the energy of which corresponds at least to that of shortwave visible light. Particularly suitable are longwave ultraviolet radiation, as well as electron emission, x-ray and laser radiation. The reproduction layers are conventionally prepared. The components can, for example, be taken up in a solvent and the resulting solution or dispersion is applied to the intended support as a thin film, by casting, spraying, immersion, or roller application and is subsequently dried. The reproduction layers are exposed and developed in the customary manner.

Suitable developers include aqueous, preferably aqueous-alkaline solutions, for example, solutions of alkali metal phosphates or alkali metal silicates, which are optionally admixed with minor amounts of miscible organic solvents and wetting agents.

The copolymers of the present invention, particularly in combination with the above-indicated perfluoroalkyl group-containing radiation-sensitive compounds or systems, yield highly radiation-sensitive reproduction layers of homogeneous appearance and good adhesion, which can usually be developed in aqueous-alkaline solutions and show an excellent ink repellency. Unexpectedly, the copolymers of the invention can still be ink repellent, if their content of fluorine-containing monomers is in the range from 10 to 20%. It is particularly surprising that the copolymers of the invention containing phenolic OH groups, can also be used as binders in reproduction layers of photopolymer printing plates having a high radiation-sensitivity, although it is assumed that phenolic OH groups acting as radical scavengers, are rather to be regarded as polymerization inhibitors.

The reproduction layers of the present invention are particularly suitable in the form of a presensitized copying material which is present on a suitable support comprising, for example, aluminum, polyester, or zinc, for use in the photomechanical production of offset-printing, plates for waterless offset printing. The surface of the support material comprising, for example, aluminum can also be modified by a mechanical, chemical and/or electrochemical roughening treatment, optionally followed by an anodic oxidation.

When support materials are only coated with one or several of the copolymers and, if appropriate, additional binders which are different from the copolymers, layers are produced which also show an excellent water and ink repellency and, at the same time, good mechanical strength. As is known from the state of the art, image areas can be produced even on such coated materials by the mechanical, electrical or chemical destruction of parts of the fluorine polymer film, or by the application of toner or by lettering. These image areas are then capable of accepting ink, so that even modified materials of that kind can optionally be used for printing.

In the preceding text and in the following examples, parts by weight are related to parts by volume as grams: $cm^3$ and percentages refer to weight, unless otherwise indicated.

EXAMPLE 1

Synthesis of a monomer component (a), corresponding to the formula (VII)

69 parts by weight of 3-hydroxybenzoic acid (0.5 mole), 142.5 parts by weight of glycidyl methacrylate (1 mole) and 1.5 parts by weight of triethylbenzylammonium chloride were heated to 80° C. during a 1 hour period. Then 60 parts by weight of the 3-hydroxybenzoic acid were additionally added and the mixture was maintained at a temperature of 80° C. for another 7 hours. The reaction product was dissolved in 190 parts by weight of warm ethanol and stabilized with 0.15 parts by weight of hydroquinone monomethyl ether.

EXAMPLE 2

Copolymerization

In a multi-necked flask equipped with condenser, thermometer, agitator, and feed vessel, 40 parts by volume of butanone-2 were heated to 70° C. under nitrogen. In the course of 3 hours, a mixture of 24 parts by weight of methacrylic acid/3-hydroxybenzoic acid-glycerol ester (corresponding to 40 parts by weight of an ethanolic solution of the reaction product of Example 1), 36.4 parts by weight of 1,1,2,2-tetrahydro-perfluorodecylacrylate, 0.48 parts by weight of azobisisobutyronitrile, and 120 parts by volume of butanone-2 were added dropwise and copolymerization was then continued for 7 hours. The solution obtained was added dropwise to 10,000 parts by volume of water, with vigorous stirring. The white, powdery precipitate which was formed was filtered off by suction, washed and dried in vacuo for 6 hours and then for another 48 hours at 60° C. in a circulating air oven.

EXAMPLES 3 TO 12 AND COMPARATIVE EXAMPLE V1

Example 2 was basically repeated, the other process parameters and the characterization of the end products are given in Table I. In the Table, Tg denotes the glass transition temperature (measured by means of a differential thermal analysis instrument), Tm the melting range (measured on a hot plate), Tz the decommposition temperature and σ the surface tension. The polymers of Examples 6 to 10 dissolved in butanone-2, while in the polymers of Example 12 and Comparative Example V1 (pure homopolymer) there was a marked decrease in solubility. In experimental series 6 to 12 and. V1, ink repellency of the polymers was good in Examples 7 to 12 and rather moderate in Example 6 and Comparative Example V1.

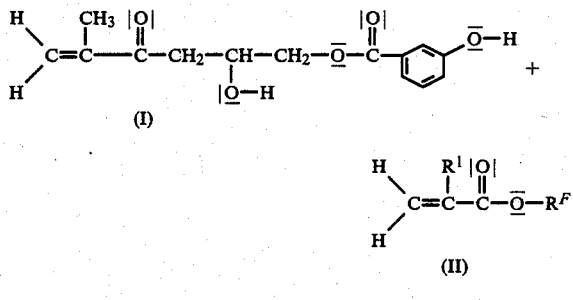

TABLE I

| | Monomers | | | | Polymer | | | | |
|---|---|---|---|---|---|---|---|---|---|
| Example | $R^1$ | $R^F$ | I/II (%) | % F | Yield (%) | % F | Tg(°C.) Tm(°C.) | Tz(°C.) | σ (mN/m) |
| 2 | H | $C_8F_{17}C_2H_4$ | 40/60 | 37.4 | 96 | 37.8 | 59/115–130 | >300 | 9.9 |
| 3 | H | $C_6F_{13}C_2H_4$ | 40/60 | 35.5 | 95 | 35.9 | 52/— | >270 | 11.5 |
| 4 | H | $C_{8.5}F_{18}C_2H_4$* | 40/60 | 37.8 | 95 | 38.3 | 59/120–135 | >280 | 13.7 |

TABLE I-continued

| | Monomers | | | Polymer | | | | |
|---|---|---|---|---|---|---|---|---|
| Example | $R^1$ | $R^F$ | I/II (%) | % F | Yield (%) | % F | Tg(°C.) Tm(°C.) | Tz(°C.) | σ (mN/m) |
| 5 | $CH_3$ | $C_6F_{13}C_2H_4$ | 40/60 | 34.3 | 93 | 34.0 | 35/120–135 | >240 | — |
| 6 | H | $C_{7.5}F_{16}C_2H_4$* | 90/10 | 12.6 | 95 | — | 73/150–170 | 256 | — |
| 7 | H | " | 70/30 | 18.9 | 93 | 19.6 | 68/150–170 | 272 | 14.3 |
| 8 | H | " | 60/40 | 25.2 | 93 | 26.2 | 66/120–140 | 255 | 14.3 |
| 9 | H | " | 50/50 | 31.5 | 98 | 32.4 | 63/130–150 | 301 | 13.8 |
| 10 | H | " | 40/60 | 37.8 | 95 | 38.3 | 59/120–135 | 283 | 13.6 |
| 11 | H | " | 30/70 | 44.1 | 95 | 44.3 | 55/115–135 | 297 | — |
| 12 | H | " | 20/80 | 50.4 | 95 | 51.0 | 47/100–115 | >300 | — |
| V1 | H | " | 100/0 | 63.0 | 88 | — | 48/80–90 | >300 | — |

*mixture of different perfluoroalkyl groups, therefore average number of C atoms

EXAMPLE 13

Synthesis of a monomer component (b) corresponding to the formula (III)

40 parts by weight of a 50% strength aqueous NaOH solution were added to 36.4 parts by weight of 1,1,2,2-tetrahydro-perfluorooctanol-1 (0.1 mole) and 0.5 part by weight of tetrabutylammoniumhydrogensulfate in 200 parts by volume of tetrahydrofuran (THF) and the solution was vigorously stirred for 15 minutes. Then 15.3 parts by weight of vinyl benzyl chloride (0.1 mole) was added dropwise during 1 hour and the mixture was stirred for 5 hours at 40° C. After adding 10 parts by weight of $K_2CO_3$ and 1 part by weight of 18-crown-6-ether, the mixture was heated to 60° C. during 7 hours. The organic phase was separated from the aqueous phase, it was twice extracted by shaking, in each case using 50 parts by volume of a saturated aqueous KCl solution, then diluted with 500 parts by volume of methylene chloride, twice extracted by shaking with water, dried with $MgSO_4$ and then filtered off from the $MgSO_4$. After adding 0.05 mg of 4-methoxyphenol as a polymerization inhibitor, the organic solvents were distilled off in a rotary evaporator and the residue was distilled in vacuo at 0.25 mmHg. According to $^1H$ and $^{19}F$-NMR spectra, the fraction at 100° C. was the perfluorohexyl-ethoxymethylstyrene.

EXAMPLE 14

Synthesis of a monomer component (b) corresponding to the formula (III)

232 parts by weight of 1,1,2,2-tetrahydroperfluorodecanol-1 (0.5 mole) and 2.5 parts by weight of triethylbenzylammoniumhydrogensulfate were dissolved in 500 parts by volume of THF and a mixture of 37 parts by weight of $K_2CO_3$ and 33 parts by weight of KOH (in each case powdered) was added to this solution. Then 76.5 parts by weight (0.5 mole) of vinyl benzyl chloride were added with stirring and stirring was continued for 8 hours at room temperature. After being allowed to stand for 48 hours, the mixture was heated to 66° C. during 8 hours with stirring and after again allowed to stand for 6 hours at room temperature, the liquid phase was decanted from the sediment which was washed twice with THF. The combined THF solutions were extracted by shaking with a saturated aqueous KCl solution and the THF phase was dried with $MgSO_4$, filtered and stabilized with 0.1 part by weight of 4-methoxyphenol. After distilling off the organic solvent in a rotary evaporator, the residue was distilled in vacuo. After a fraction consisting of unreacted perfluoroalkanol, the desired perfluorooctylethoxy-methylstyrene was recovered at 0.5 mmHg, at a temperature between 118° and 125° C.

EXAMPLES 15 AND 16

Copolymerization

According to Example 2, the products obtained in Examples 13 and 14 were copolymerized with the glycerol ester of Example 2:

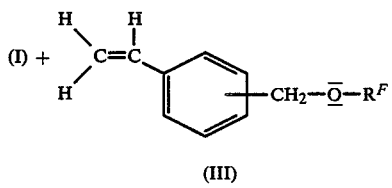

(III)

EXAMPLES 17 AND 18

Copolymerization

According to Example 2, perfluoroalkyl group-containing acrylic esters [$R^1$=H in the formula (II)] were copolymerized with an acrylic acid/2-hydroxybenzoic acid ethyleneglycol ester:

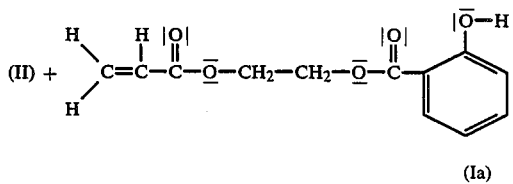

(Ia)

TABLE II

| Example | $R^F$ | Monomers I/III (%) | Monomers Ia/II (%) | % F | Polymer Yield (%) | % F | Tg (°C.) | Tm (°C.) |
|---|---|---|---|---|---|---|---|---|
| 15 | $C_6F_{13}C_2H_4$ | 70/30 | — | 36.1 | 88 | 36.1 | 32 | — |
| 16 | $C_8F_{17}C_2H_4$ | 60/40 | — | 33.4 | 91 | 33.9 | — | — |
| 17 | $C_{8.5}F_{18}C_2H_4$ | — | 40/60 | 37.8 | 96 | 37.9 | 16 | 50–70 |
| 18 | $C_8F_{17}C_2H_4$ | — | 40/60 | 37.4 | 97 | 37.1 | 16 | 50–70 |

EXAMPLE 19

Example of Application

The polymers according to the present invention obtained in Examples 2 to 12 and 15 to 18 were, in each case, dissolved in butanone-2 or a mixture of butanone-2 and 1-methoxypropanol-2, respectively, and spin-coated on a roughened aluminum foil. The coatings were then dried for 1 to 2 minutes by means of a fan and thereafter for 1 minute in a drying oven at 100° C. The resulting plates were rolled up with a commercially available printing ink for waterless offset printing. Ink repellency of the plates were excellent to good and they were practically free from scum (polymers of Examples 2, 4, 5, 7 to 9 and 15 to 18) or showed only very little scum (polymers of Examples 3, 6 and 10 to 12). In subsequent printing tests using coated aluminum specimens and also uncoated specimens on a printing machine, the damping unit of which had been switched off, comparable results were obtained.

EXAMPLES 20 TO 37

Examples of Application

A reproduction layer was prepared from each of the products synthesized in Examples 2 to 18 used as an organic polymeric binder in admixture with a polymerizable monomer or oligomer, a photoinitiator, and a dye. For this purpose, a solution or dispersion of the components in an organic solvent (butanone-2 or 1-methoxypropanol-2) was normally prepared and coated on a support material, for example, an electrochemically roughened aluminum foil or a polyester film. Then the radiation-sensitive coating was dried. To prevent oxygen diffusion, a covering layer of polyvinyl alcohol was applied to the reproduction layer.

The resulting offset-printing plates were exposed for 20 to 150 seconds to the light of a metal halide lamp (5 kW) arranged at a distance of 100 cm from the vacuum copying frame, through a positive original. The exposed material could usually be developed with a 3% strength aqueous solution of $Na_2SiO_3$ (El). After rinsing with water and briefly drying at 100° C., the printing plates produced could be used for dry printing (i.e., the damping unit of a printing machine was switched off), using commercially available special inks for waterless offset printing. The ink receptive areas included portions of the surface of the support material, while the ink repellent areas comprised the remaining portions of the reproduction layer.

In all Examples, 2-(4-ethoxy-naphth-1-yl)-4,6-bis-trichloromethyl-s-triazine was used as the photoinitiator, and the polymerizable compound comprised one of the perfluoroalkyl group-containing monomers or oligomers mentioned in the specification and described for the first time in German patent application No. P 34 21 511.5. These are:

PM1 (reaction product obtained from pentaerythritol-triacrylate and a mixture of 2,2-dihydro-perfluoro-($C_8$–$C_{14}$)-alkanoic acid chlorides PM2 (esterification product obtained from a reaction product of a perfluoroalkanol and benzophenone-tetracarboxylic acid anhydride with the methacrylic acid ester of 1,2-epoxy-propanol-3)

PO1 (oligomer of PM 2 and hexane-1,6-diisocyanate)

PO2 (oligomer of PM2 and toluene-1,4-diisocyanate)

The criteria which were considered in evaluating the reproduction layer were the coating quality (G=good, S=satisfactory, M=moderate, P=poor) determined by visual examination prior to irradiation, development and inking and, following these process steps, the number of clean or solid steps, respectively, in a 13-step continuous tone step wedge of a wedge constant (density gradation) of 0.15 (e.g., exposure test wedge "BK01" of KALLE Niederlassung der Hoechst AG) and the reproduction of extremely fine image elements in a 12-step, 150-dot screen halftone wedge, starting from a tonal value of 5% in step 1 and ending with a tonal value of 95% in step 12 (e.g., halftone wedge "RK01" of KALLE Niederlassung der Hoechst AG); in the application of the halftone wedge, the table indicates, on the one hand, the number of steps which still repelled ink (v) (i.e., which show non-image areas) and, on the other hand, the step which was the first to accept ink (w).

The polymer of Example 6 did not yet show an adequate ink repellency, while the polymers of Examples 12 and V1 yielded reproduction layers which could not be completely developed or could no longer be developed with purely aqueous-alkaline solutions, so that ink receptivity of the image areas was not very good (Examples 26 and 27).

TABLE III

| Components, treating agents, judgment | | | Parts by weight of components (and other parameters) in Example | | | | | | | | |
|---|---|---|---|---|---|---|---|---|---|---|---|
| | | | 20 | 21 | 22 | 23 | 24 | 25 | 26 | 27 | 28 |
| polymerizable monomer or oligomer | PM1 | | 1.0 | 1.0 | 1.0 | 1.0 | 1.0 | 1.0 | 1.0 | 1.0 | 1.0 |
| | PO1 | | 0.5 | 0.5 | 0.5 | 0.5 | 0.5 | 0.5 | 0.5 | 0.5 | 0.5 |
| | PO2 | | | | | | | | | | |
| as the binder polymer of | Ex. | 2 | | | | | | | | | |
| | | 3 | | | | | | | | | |
| | | 4 | | | | | | | | | | 1.0 |
| | | 5 | | | | | | | 1.0 | | | |
| | | 6 | | 1.0 | | | | | | | | |
| | | 7 | | | 1.0 | | | | | | | |

TABLE III-continued

| | | 29 | 30 | 31 | 32 | 33 | 34 | 35 | 36 | 37 |
|---|---|---|---|---|---|---|---|---|---|---|
| | 8 | | | | | | 1.0 | | | |
| | 10 | | | | | | | 1.0 | | |
| | 11 | | | | | | | | 1.0 | |
| | 12 | | | | | | | | | 1.0 |
| | V1 | | | | | | | | | |
| | 15 | | | | | | | | 1.0 | |
| | 16 | | | | | | | | | |
| photoinitiator | | 0.05 | 0.05 | 0.05 | 0.05 | 0.05 | 0.05 | 0.05 | 0.05 | 0.05 |
| dye | | 0.02 | 0.02 | 0.02 | 0.02 | 0.02 | 0.02 | 0.02 | 0.02 | 0.02 |
| butanone-2 | | 15 | 15 | 15 | 15 | 15 | 15 | 15 | 15 | 15 |
| coating quality | | P | G | G | G | G | M | P | P | G |
| exposure time (seconds) | | 50 | 50 | 50 | 50 | 50 | 50 | 50 | 50 | 50 |
| developer | | E1 | E1 | E1 | E1 | E1 | E1 | E1 | E1 | E1 |
| developing time (minutes) | | 0.5 | 1.0 | 1.5 | 1.5 | 1.5 | 2.0 | >2.0 | >5.0 | 1.5 |
| cont. tone step wedge (x/y)* | | 0/4 | 4/5 | 6/7 | 4/6 | 6/8 | 6/8 | 12/13 | 12/— | 7/10 |
| halftone step wedge (v/w) | | 8/2 | 10/3 | 12/2 | 12/2 | 12/3 | 11/4 | — | — | 12/3 |

| Components, treating agents, judgment | | Parts by weight of components (and other parameters) in Example | | | | | | | | |
|---|---|---|---|---|---|---|---|---|---|---|
| | | 29 | 30 | 31 | 32 | 33 | 34 | 35 | 36 | 37 |
| polymerizable monomer or oligomer as the binder polymer of | PM1 | 1.0 | 0.5 | 1.0 | 0.5 | 1.0 | 1.0 | 1.0 | 1.0 | 1.0 |
| | PO1 | 0.5 | 0.5 | 0.5 | 0.5 | 0.5 | | | 0.5 | 0.5 |
| | PO2 | | | | | | 0.5 | 0.5 | | |
| | Ex. 2 | | 1.0 | 1.0 | | | | 1.0 | | |
| | 3 | | | | 1.0 | 1.0 | | | | |
| | 4 | 1.0 | | | | | 1.0 | | | |
| | 5 | | | | | | | | | |
| | 6 | | | | | | | | | |
| | 7 | | | | | | | | | |
| | 8 | | | | | | | | | |
| | 10 | | | | | | | | | |
| | 11 | | | | | | | | | |
| | 12 | | | | | | | | | |
| | V1 | | | | | | | | | |
| | 15 | | | | | | | | 1.0 | |
| | 16 | | | | | | | | | 1.0 |
| photoinitiator | | 0.05 | 0.05 | 0.05 | 0.05 | 0.05 | 0.05 | 0.05 | 0.05 | 0.05 |
| dye | | 0.02 | 0.02 | 0.02 | 0.02 | 0.02 | 0.02 | 0.02 | 0.02 | 0.02 |
| butanone-2 | | 15 | 15 | 15 | 15 | 15 | 15 | 15 | 15 | 15 |
| coating quality | | G | G | G | G | G | M | M | M | M |
| exposure time (seconds) | | 50 | 50 | 50 | 50 | 50 | 50 | 50 | 50 | 50 |
| developer | | E1 | E1 | E1 | E1 | E1 | E1 | E1 | E1 | E1 |
| developing time (minutes) | | 1.5 | 1.5 | 1.5 | 1.5 | 1.5 | 1.5 | 1.5 | 2.0 | 1.5 |
| cont. tone step wedge(x/y) | | 5/7 | 8/13 | 10/12 | 8/10 | 10/12 | 7/9 | 5/8 | 10/12 | 11/13 |
| halftone step wedge (v/w) | | 11/2 | 12/3 | 12/3 | 11/2 | 12/3 | 12/3 | 12/2 | 5/4 | 12/4 |

*x = number of solid steps
y = sum of solid steps and ghost steps

The foregoing description of preferred embodiments has been set forth merely to illustrate the invention and is not intended to be limiting. Since modifications of the described embodiments incorporating the spirit and substance of the invention may occur to persons skilled in the art, the scope of the invention should be limited solely with respect to the appended claims and equivalents.

What is claimed is:

1. A radiation-sensitive reproduction composition, which, after image-wise irradiation, is capable of being developed by washing out with an aqueous-alkaline solution, comprising an admixture of:

at least one radiation-sensitive compound present in an amount sufficient to alter the solubility of the composition in an aqueous alkaline solution after irradiation; and an organic binder soluble in aqueous-alkaline solutions, said binder being a copolymer selected from the group consisting of the reaction products of:

(a) at least one monomer containing acryloyl or methacryloyl groups and phenolic OH groups and corresponding to the formula (I)

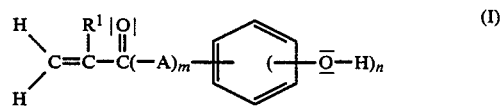

wherein $R^1$ is H or $CH_3$; n is 1, 2, or 3; m is 0 or 1 and A is selected from the group consisting of:

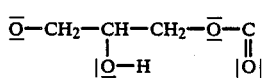

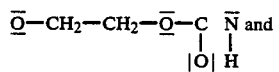

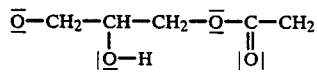

(b) at least one monomer containing acryloyloxy, methacryloyloxy or vinyl groups and a perfluoroalkyl group and corresponding to formulae (II) or (III)

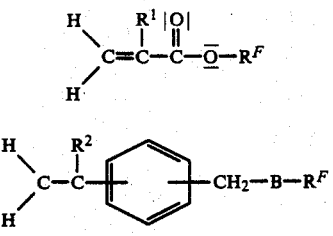

wherein $R^1$ has the above meaning, $R^2$ is H or alkyl from $C_1$ to $C_5$;

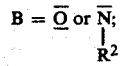

$R^F$ is $F(C_wF_{2w})(-CH_2)_z$ or $F(C_{w-1}F_{2w-2})-CF=CH$, $F(C_wF_{2w})(-CH_2)_2$ is selected from the group consisting of (1) there being no linking bridging groups and (2) there being linking ether bridging groups; w is 5 to 15 and z is 0 to 5;

wherein said copolymer is present in an amount sufficient to obtain a film forming coating and to permit aqueous alkaline development of the image-wise exposed layer.

2. A reproduction layer as claimed in claim 1, comprising at least one radiation-sensitive compound containing at least one perfluoroalkyl group.

3. A reproduction layer as claimed in claim 1, wherein said at least one radiation-sensitive compound is a polymerizable compound containing perfluoroalkyl groups and having at least two ethylenically unsaturated end groups, and said reproduction layer further comprises at least one photoinitiator.

4. A reproduction composition as claimed in claim 3, wherein the reproduction layer contains from 5 to 50% of the radiation-sensitive compound.

5. A reproduction composition as claimed in claim 3, wherein the reproduction layer contains from 50 to 95% of the copolymer binder.

6. A reproduction layer as claimed in claim 1, wherein the radiation-sensitive compound comprises at least one 1,2-naphthoquinone diazide compound having at least one perfluoroalkyl group as a substituent.

7. A reproduction composition as claimed in claim 6, wherein the reproduction layer contains from 5 to 80% of the radiation-sensitive compound.

8. A reproduction composition as claimed in claim 1, wherein the amount of said radiation sensitive compound in said composition is from about 5 to about 50% by weight and the amount of organic binder in said composition is from about 95 to about 50% by weight.

9. A reproduction composition as claimed in claim 1, wherein said radiation sensitive compound comprises a photopolymerizable compound present in an amount of up to 80% by weight and wherein the amount of organic binder in said composition is up to about 20% by weight.

10. A radiation sensitive printing plate, comprising a support member and a radiation sensitive reproduction layer on said support, wherein the reproduction layer comprises a radiation sensitive composition as defined by claim 1.

* * * * *